US012218165B2

(12) United States Patent
Kao et al.

(10) Patent No.: US 12,218,165 B2
(45) Date of Patent: Feb. 4, 2025

(54) SEMICONDUCTOR IMAGE SENSOR AND METHOD OF MANUFACTURING THE SAME

(71) Applicant: TAIWAN SEMICONDUCTOR MANUFACTURING COMPANY LTD., Hsinchu (TW)

(72) Inventors: Min-Feng Kao, Chiayi (TW); Dun-Nian Yaung, Taipei (TW); Jen-Cheng Liu, Hsin-Chu (TW); Hsing-Chih Lin, Tainan (TW); Che-Wei Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 673 days.

(21) Appl. No.: 17/351,228

(22) Filed: Jun. 18, 2021

(65) Prior Publication Data
US 2022/0406824 A1    Dec. 22, 2022

(51) Int. Cl.
*H01L 27/146* (2006.01)

(52) U.S. Cl.
CPC .... *H01L 27/1463* (2013.01); *H01L 27/14629* (2013.01); *H01L 27/14636* (2013.01); *H01L 27/14685* (2013.01)

(58) Field of Classification Search
CPC ......... H01L 27/14629; H01L 27/14636; H01L 27/14685; H01L 27/1463
See application file for complete search history.

(56) References Cited

U.S. PATENT DOCUMENTS

| | | | |
|---|---|---|---|
| 2018/0204874 A1* | 7/2018 | Lee | H04N 25/11 |
| 2019/0172868 A1* | 6/2019 | Chen | G02B 27/0172 |
| 2020/0119067 A1* | 4/2020 | Choi | H04N 25/40 |
| 2023/0178576 A1* | 6/2023 | Maeda | H01L 27/1463 257/292 |

* cited by examiner

*Primary Examiner* — Nilufa Rahim
(74) *Attorney, Agent, or Firm* — WPAT LAW; Anthony King

(57) ABSTRACT

An image sensor includes a substrate including a first surface and a second surface opposite to the first surface; a plurality of pixel sensors disposed in the substrate, a sensor isolation feature disposed in the substrate defining an active region, and a dielectric layer between the sensor isolation feature and the substrate, wherein the sensor isolation feature comprises a conductive material.

20 Claims, 17 Drawing Sheets

SEMICONDUCTOR IMAGE SENSOR AND METHOD OF MANUFACTURING THE SAME

BACKGROUND

Digital cameras and other imaging devices employ images sensors. Image sensors convert optical images to digital data that may be represented as digital images. An image sensor includes an array of pixel sensors and supporting logic circuits. The pixel sensors of the array are unit devices for measuring incident light, and the supporting logic circuits facilitate readout of the measurements. The size of isolation structures between adjacent pixels sensors, however, cannot be reduced as the pixel size shrinks, and thus becomes a bottleneck for small pixel design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
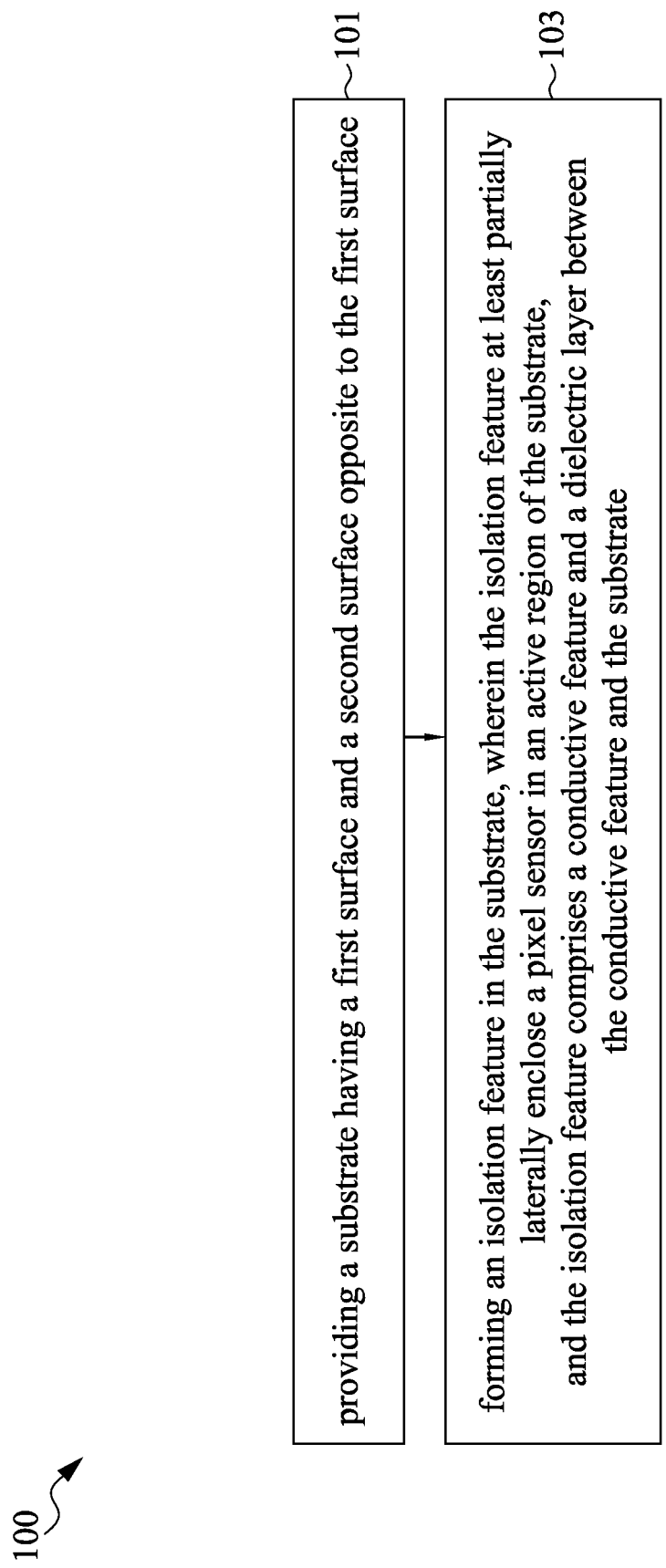
FIG. 1 illustrates a flowchart of a method for manufacturing an image sensor in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

An image sensor typically includes one or more arrays of pixel sensors separated by a deep doped well region. The deep doped well region is used for grounding and provides isolation bias. As the size of the image sensors shrinks, a number of challenges are encountered with respect to the manufacturing of the image sensors. One challenge with the image sensors is producing the deep doped well region with a shrunk width while pertaining a suitable depth or a deeper depth when the thickness of the substrate, such as a silicon wafer, increases. Higher aspect ratio of the deep doped well region uses higher energy implant for preparing such deep doped well region, which is hard to be achieved. Therefore, an improved method for producing isolation between the pixel sensors of the image sensor is needed.

Some embodiments of the present disclosure therefore provide an image sensor including a sensor isolation feature for separating the pixel sensors in a substrate, wherein the sensor isolation feature may include a conductive material and a dielectric material disposed between the conductive material and the substrate. The sensor isolation feature may provide a physically partial isolation, i.e., the sensor isolation feature may have a depth less than the depth of the pixel sensors. The electrical isolation of the pixel sensors may be provided by applying a bias to the sensor isolation structure of the image sensor. In addition, the sensor isolation feature may be manufactured in a manner such that the sensor isolation feature may be formed together with a reflector grid for better collecting the incident light entering the image sensor, and the quantum efficiency of the image sensor may also be improved with the use of the sensor isolation feature.

Refer to FIG. 1. FIG. 1 illustrates a flowchart of a method 100 for manufacturing an image sensor in accordance with some embodiments of the present disclosure. The method 100 begins with operation 101 in which a substrate including a first surface and a second surface opposite to the first surface is provided. In some embodiments, the substrate may include a plurality of transistors. In some embodiments, the plurality of transistors may be disposed adjacent to the first surface of the substrate. In some embodiments, the plurality of transistors may be disposed adjacent to the second surface of the substrate. In some embodiments, an interconnect feature may be disposed on the surface of the substrate where the plurality of transistors are near.

The method 100 proceeds with operation 103 in which an isolation feature is formed in the substrate. The isolation feature may at least partially laterally enclose a pixel sensor in an active region of the substrate. The isolation feature may include a conductive feature and a dielectric layer between the conductive feature and the substrate. In some embodiments, the isolation feature may be formed in the substrate adjacent to the second surface of the substrate while the plurality of transistors may be disposed adjacent to the first surface of the substrate.

In some embodiments, a connection feature may be formed in the substrate. The connection feature is electrically connected to the isolation feature. In some embodiments, the connection feature may be electrically connected to one or more of the plurality of the transistors. In some embodiments, the isolation feature formed in the substrate may define the active region. In some embodiments, the connection feature may be formed in a periphery region of the substrate, where the "periphery region" refers to a region other than the active region of the substrate. In some embodiments, the connection feature may be formed in the periphery region simultaneously with the isolation feature. In some embodiments, a doped well region may be formed within the substrate. In some embodiments, the dope well region may be electrically connected to the connecting feature.

In some embodiments, additional operations are performed before, during, and/or after the operations 101 to 103 shown in FIG. 1 for manufacturing the image sensor, and some of the operations described can be replaced or eliminated for other embodiments of the method.

Some embodiments of the method of the present disclosure may be further explained by the following descriptions accompanied by FIGS. 2A to 2H, which illustrate schematic cross-sectional views of an image sensor 200 at various stages of fabrication in accordance with some embodiments of the present disclosure.

Figure 2A:
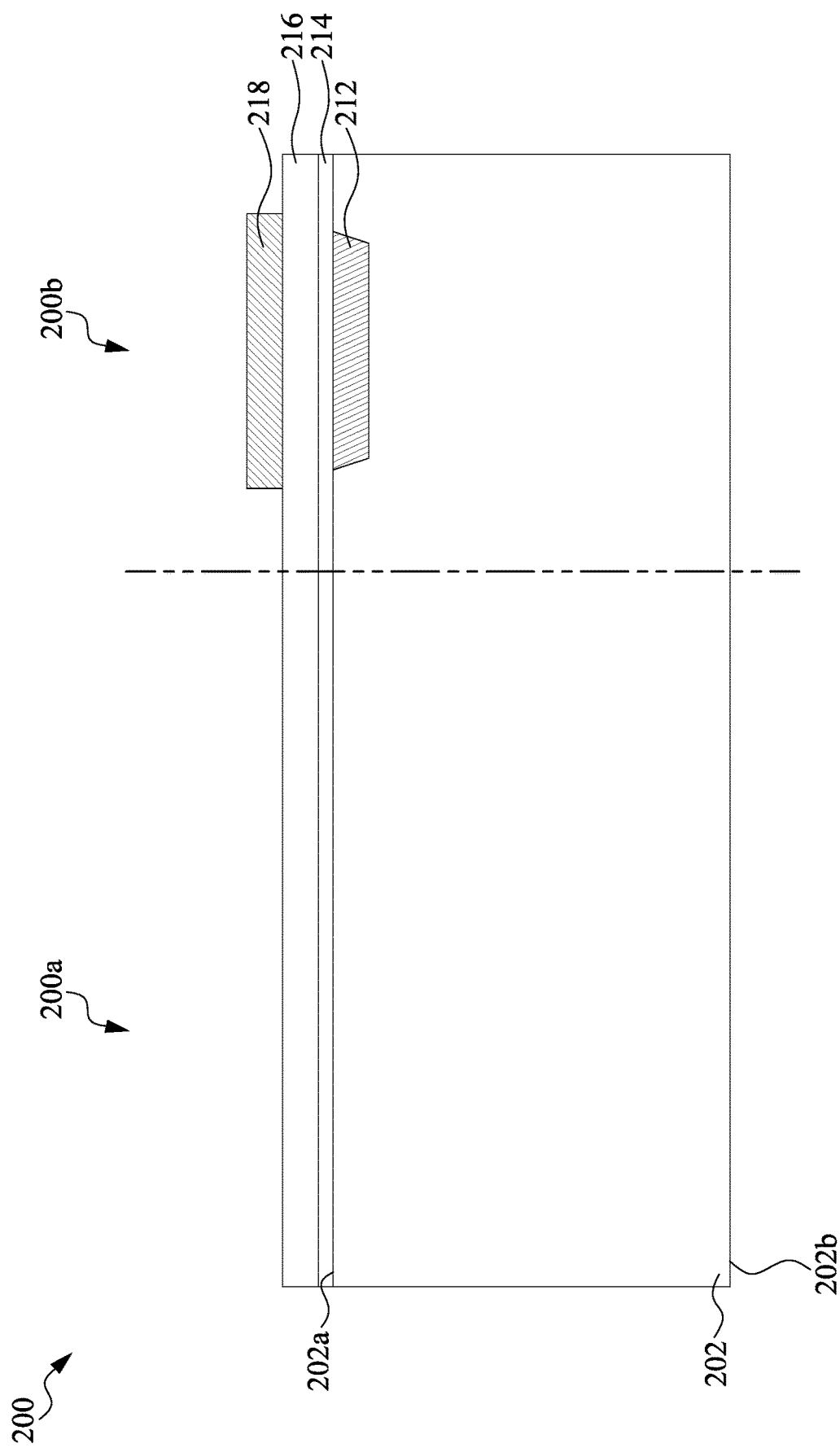
FIGS. 2A to 2H illustrate schematic cross-sectional views of an image sensor at various stages of fabrication in accordance with some embodiments of the present disclosure.

Refer to FIG. 2A. FIG. 2A illustrates a schematic cross-sectional view of an image sensor 200 in accordance with some embodiments of the present disclosure. In some embodiments, the image sensor may include a substrate 202 including a first surface 202a and a second surface 202b opposite to the first surface 202a. In some embodiments, a plurality of active elements such as transistors are formed on the first surface 202a of the substrate 202, wherein neighboring active elements of the plurality of active elements are separated by an isolation region 212, such as shallow trench isolation region, formed within the substrate 202 adjacent to the first surface 202a of the substrate. In some embodiments, an interconnect feature 218 may be formed over the first surface 202a of the substrate 202. The interconnect feature 218 refers to the conductive wiring for connecting two or more of the active elements together electrically. A bias may be applied to the active elements through the interconnect feature 218 to control the functions of the active elements. In some embodiments, the active elements may be electrically connected to an interconnect feature 218 through a contact feature 220 formed on the active elements. In some embodiments, one or more layer(s) may be formed between the interconnect structure and the active elements, such as an etch stop layer 214 and an inter-layer dielectric layer 216. The etch stop layer 214 may be a contact etch stop layer.

Figure 2B:
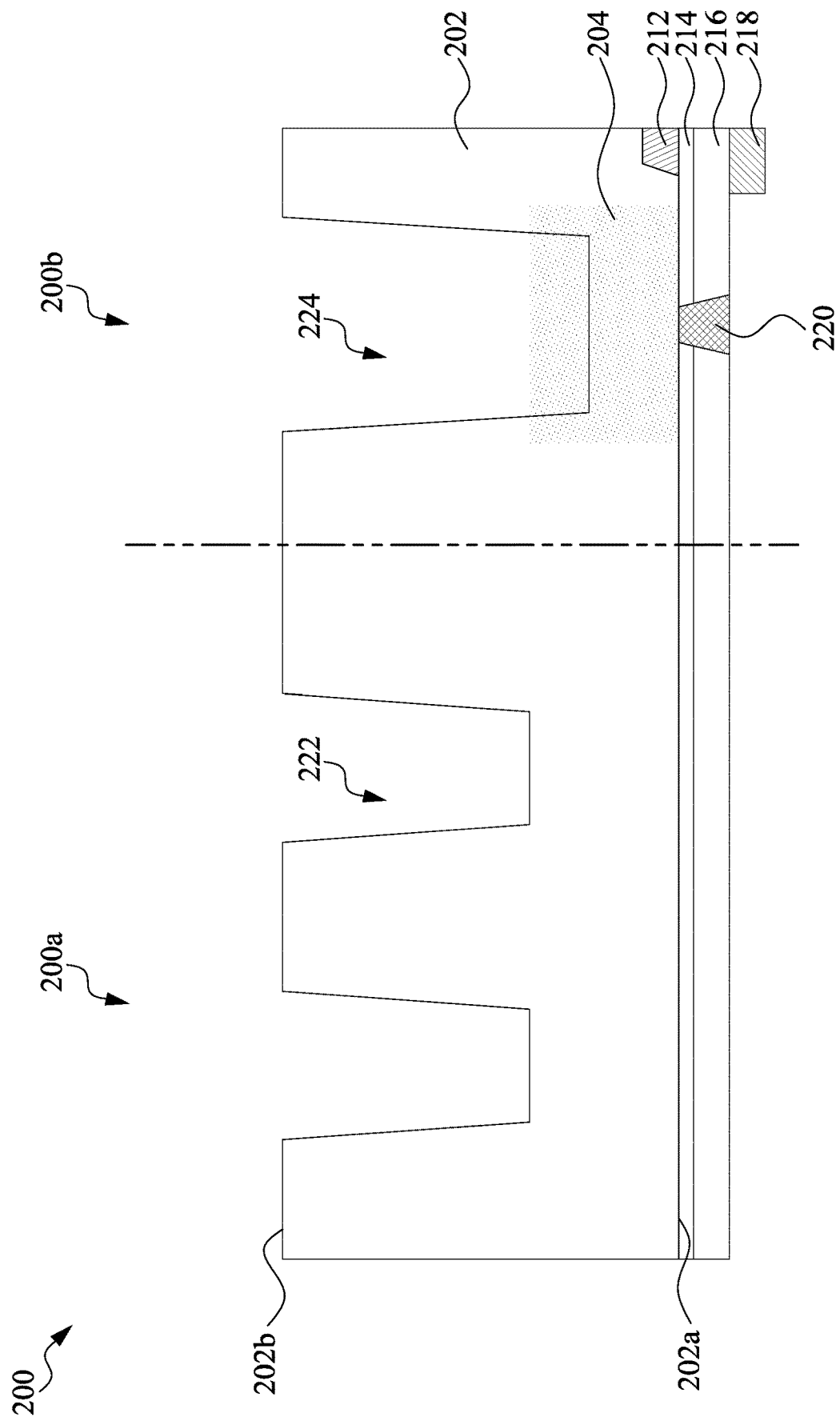

Refer to FIG. 2B. FIG. 2B illustrates a schematic cross-sectional view of an image sensor 200 in accordance with some embodiments of the present disclosure. In some embodiments, a doped well region 204 may be formed within the substrate 202 after the isolation region 204 is formed. In some embodiments, the doped well region 204 may be formed by implantation from the first surface 202a of the substrate 202. In some embodiments, the doped well region 204 may be formed to be aligned with the contact feature, 220. In some embodiments, after the doped well region 204 is formed, the substrate 202 may be flipped over so as to expose the second surface 202b of the substrate 202 for further operations. In some embodiments, a first hole 222 is formed in the active region 200a of the substrate 202 and a second hole 224 may be formed in the periphery region 200b of the substrate 200. In some embodiments, a photolithographic operation may be performed to the second surface 202b of the substrate 202 to define a pattern of the first hole 222 and the second hole 224. In some embodiments, an etching operation may be performed to the second surface 202b of the substrate 202 to remove a portion of the substrate 202 to form the first hole 222 and the second hole 224. In some embodiments, the etching operation may include a wet etching operation and a dry etching operation, or a combination thereof. In some embodiments, the second hole 224 may be partially inserted into the doped well region 204. In some embodiments, the second hole 224 may be designed to have a width greater than the width of the first hole 222. Such difference may cause the etching rate to produce the second hole 224 faster than that to produce the first hole 224 and thus cause the depth of the second hole 224 being deeper than that of the first hole 222.

Figure 2C:
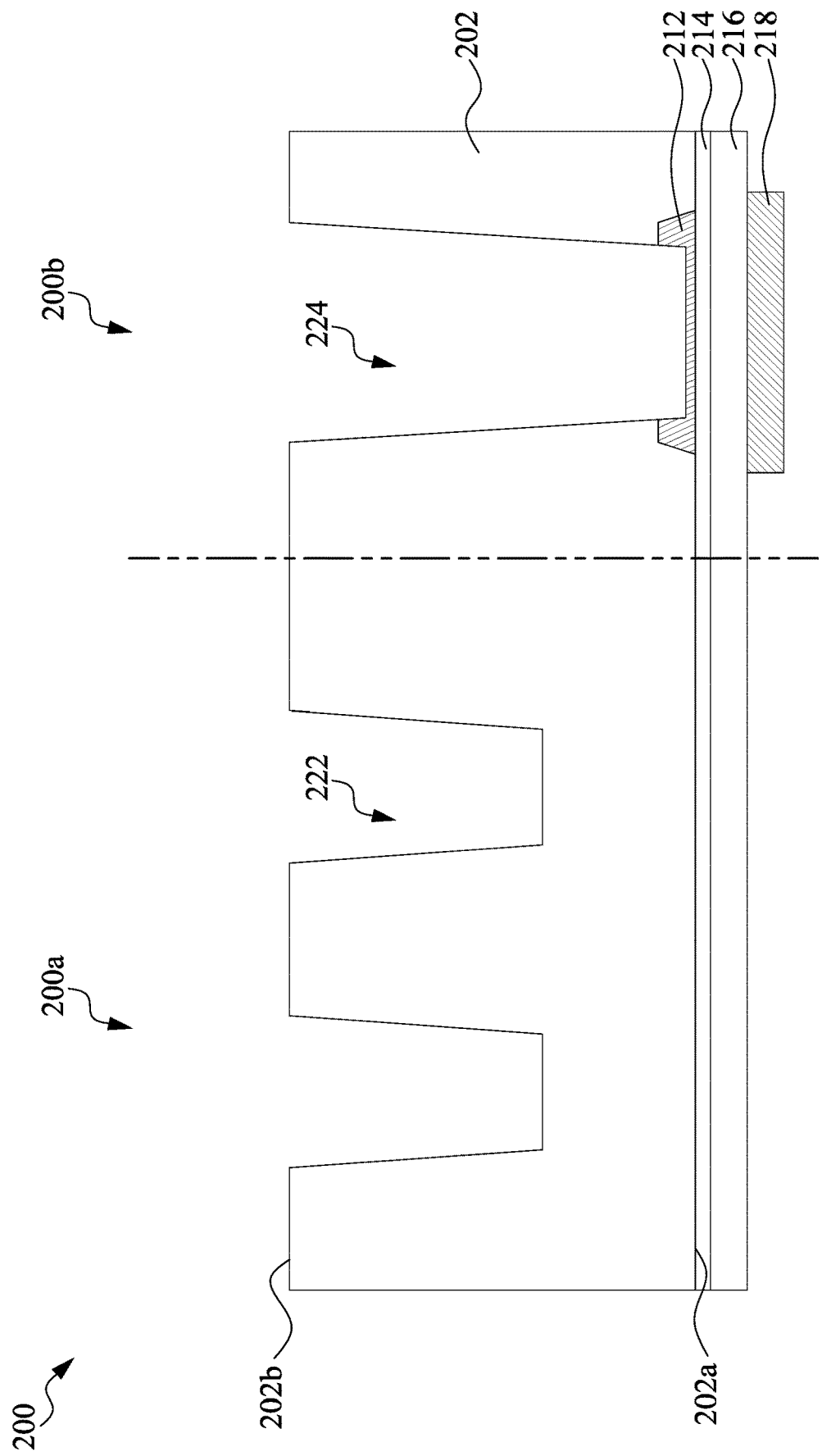

Refer to FIG. 2C. FIG. 2C illustrates a schematic cross-sectional view of an image sensor 200 in accordance with some embodiments of the present disclosure. In some embodiments, after the operations to be applied on the first surface 202a of the substrate 202 are carried out as shown in FIG. 2A, the substrate 202 may be flipped over so as to expose the second surface 202b of the substrate 202 for further operations. In some embodiments, a first hole 222 may be formed in the active region 200a of the substrate 200 and a second hole 224 may be thrilled in the periphery region 200b of the substrate 202. In some embodiments, different from the configuration of the image sensor 200 as shown in FIG. 2B, the second hole 224 may be formed aligned to an isolation region 212. In some embodiments, a photolithographic operation may be performed to the second surface 202b of the substrate 202 to define a pattern of the first hole 222 and the second hole 224. In some embodiments, an etching operation may be performed to the second surface 202b of the substrate 202 to remove a portion of the substrate 202 to form the first hole 222 and the second hole 224. In some embodiments, the etching operation may include a wet etching operation and a dry etching operation, or a combination thereof. In some embodiments, the second hole 224 may be designed to have a width greater than the width of the first hole 222. Such difference may cause the etching rate to produce the second hole 224 faster than that to produce the first hole 224 and thus cause the depth of the second hole 224 being deeper than that of the first hole 222.

Figure 2D:
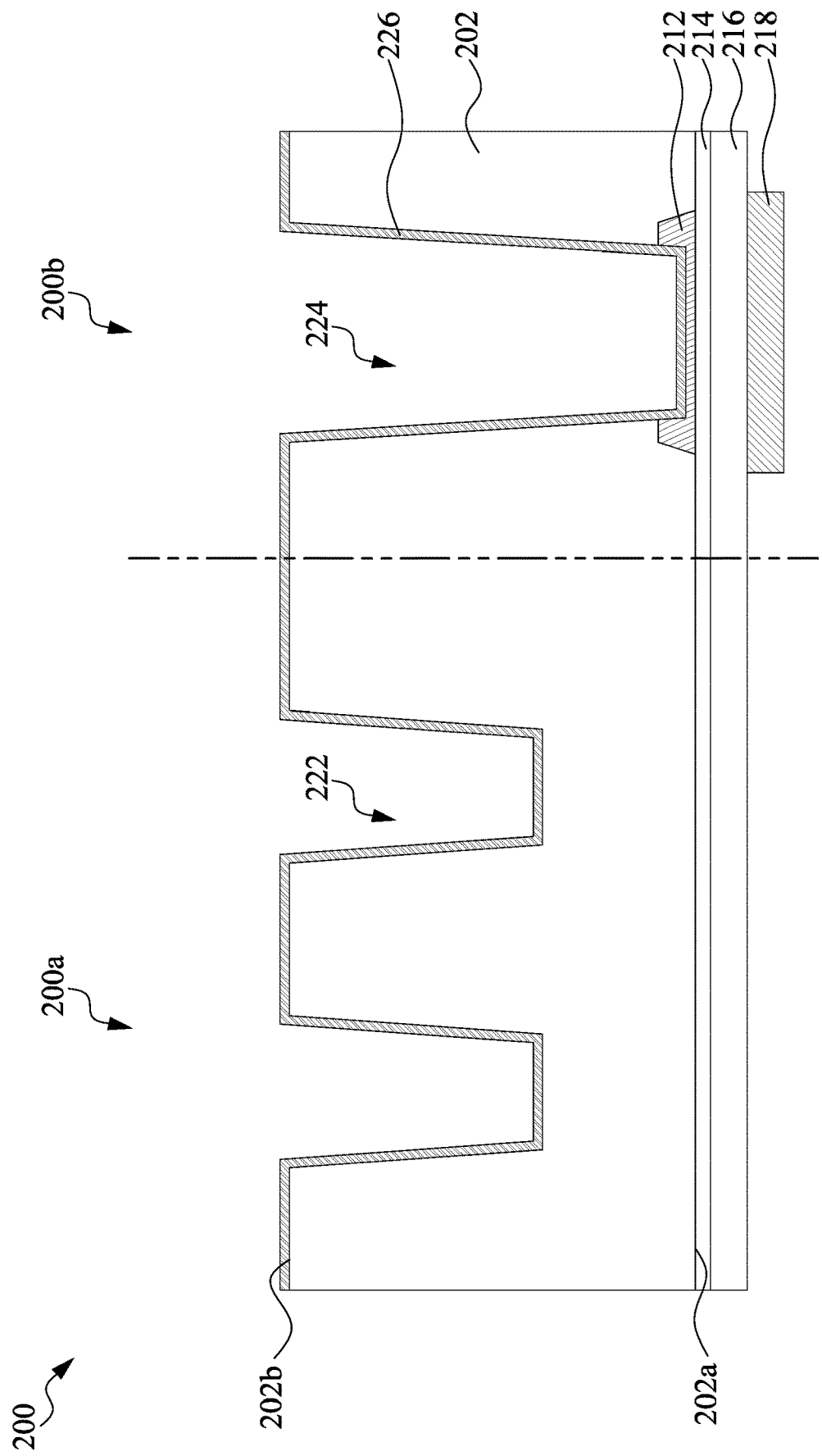

Refer to FIG. 2D. FIG. 2D illustrates a schematic cross-sectional view of an image sensor 200 in accordance with some embodiments of the present disclosure. In some embodiments, after the first hole and the second hole are formed, the dielectric layer 226 may be formed on sidewalls and a bottom of the first hole 222 and sidewalls and a bottom of the second hole 224. In some embodiments, the dielectric layer 226 may be formed by a deposition operation, such as chemical vapor deposition (CVD), plasma enhanced chemical vapor deposition (PECVD), physical vapor deposition (PVD) or atomic layer deposition (ALD). In some embodiments, the dielectric layer 226 may be formed by ALD.

Figure 2E:
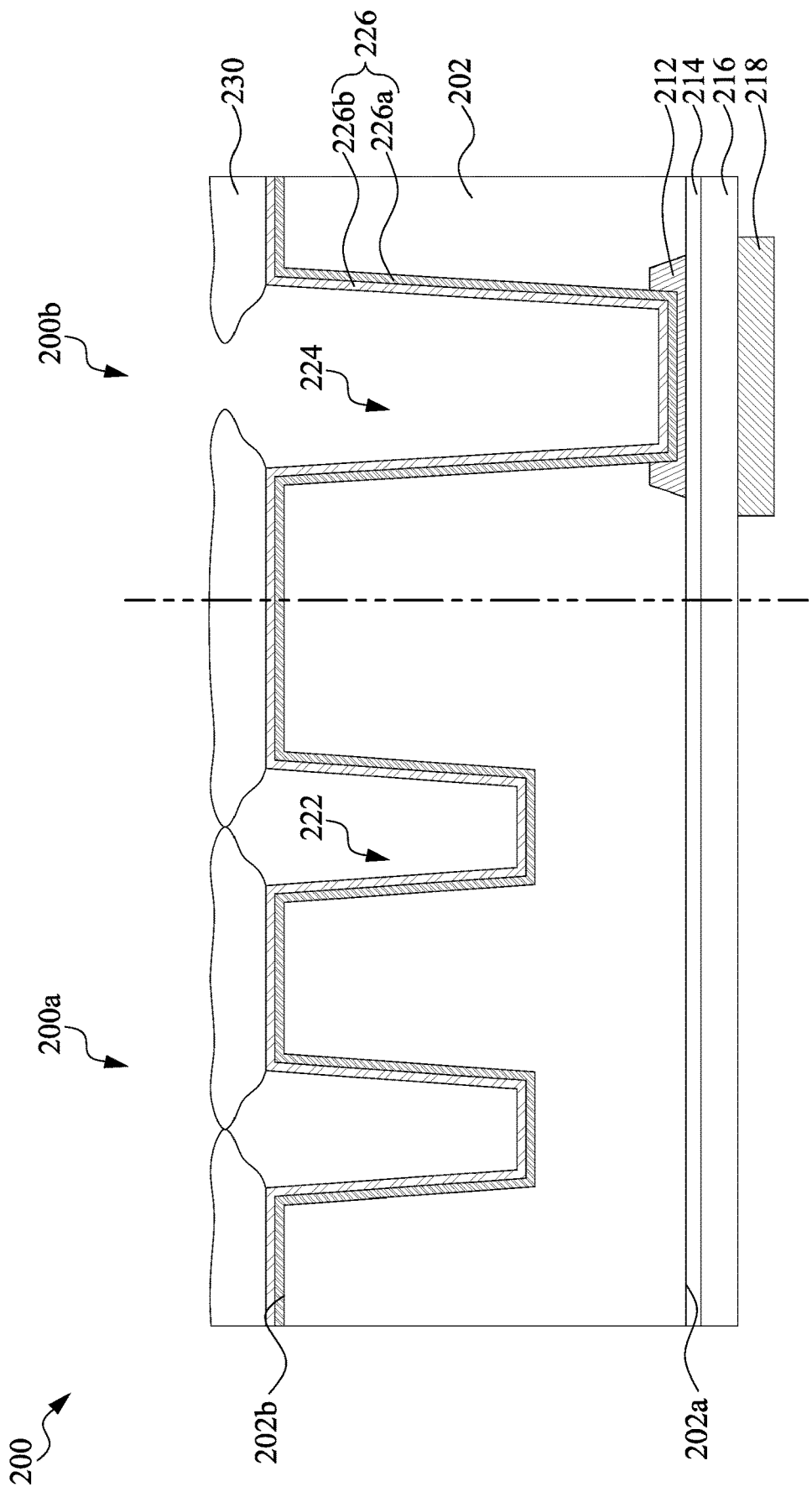

Refer to FIG. 2E. FIG. 2E illustrates a schematic cross-sectional view of an image sensor 200 in accordance with some embodiments of the present disclosure. In some embodiments, the dielectric layer 226 may include one or more dielectric films. In some embodiments a first dielectric film 226a may be formed on sidewalls and a bottom of the first hole 222 and the second hole 224 and a second dielectric film 226b may be formed over the first dielectric film 226a. In some embodiments, an insulating layer 230 may be formed on the second surface 202b of the substrate. In some embodiments, the insulating layer 230 may be formed by CVD, PVD, PECVD, or ALD. In some embodiments, the insulating layer 230 may be formed by PECVD. In some embodiments, the insulating layer 230 may include an oxide material. In some embodiments, the insulating layer 230 may be formed on the second surface 202b of the substrate 202, and the insulating layer 230 grows laterally so that the first hole 222 may be sealed by the insulating layer 230 while a portion of the second hole 224 may be partially sealed.

Figure 2F:
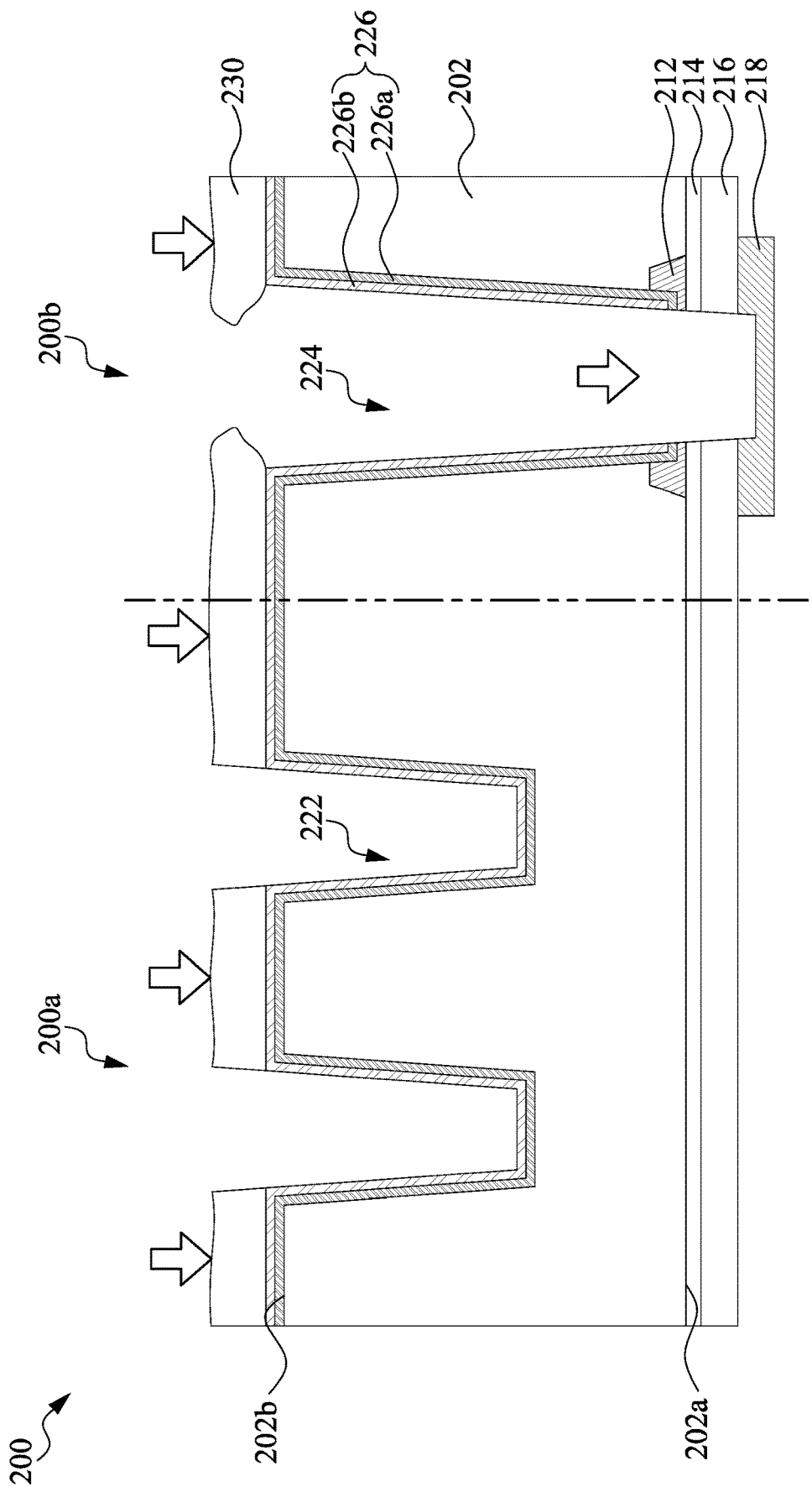

Refer to FIG. 2F. FIG. 2F illustrates a schematic cross-sectional view of an image sensor 200 in accordance with some embodiments of the present disclosure. In some embodiments, an etching operation may be applied to the insulating layer 230 to remove a portion of the insulating layer 230 so as to expose the first hole 222 and to remove the dielectric layer 226 on the bottom of the second hole 224. In some embodiments, the etching operation may be a blanket etching operation. In some embodiments, the etching operation may include a wet etching operation and a dry etching operation, or a combination thereof. In some embodiments, the second hole 224 may extend through the isolation region 212. In some embodiments, the second hole 224 may extend through the substrate 202 to reach the interconnect structure 218 formed on the first surface 202a of the substrate 202.

Figure 2G:
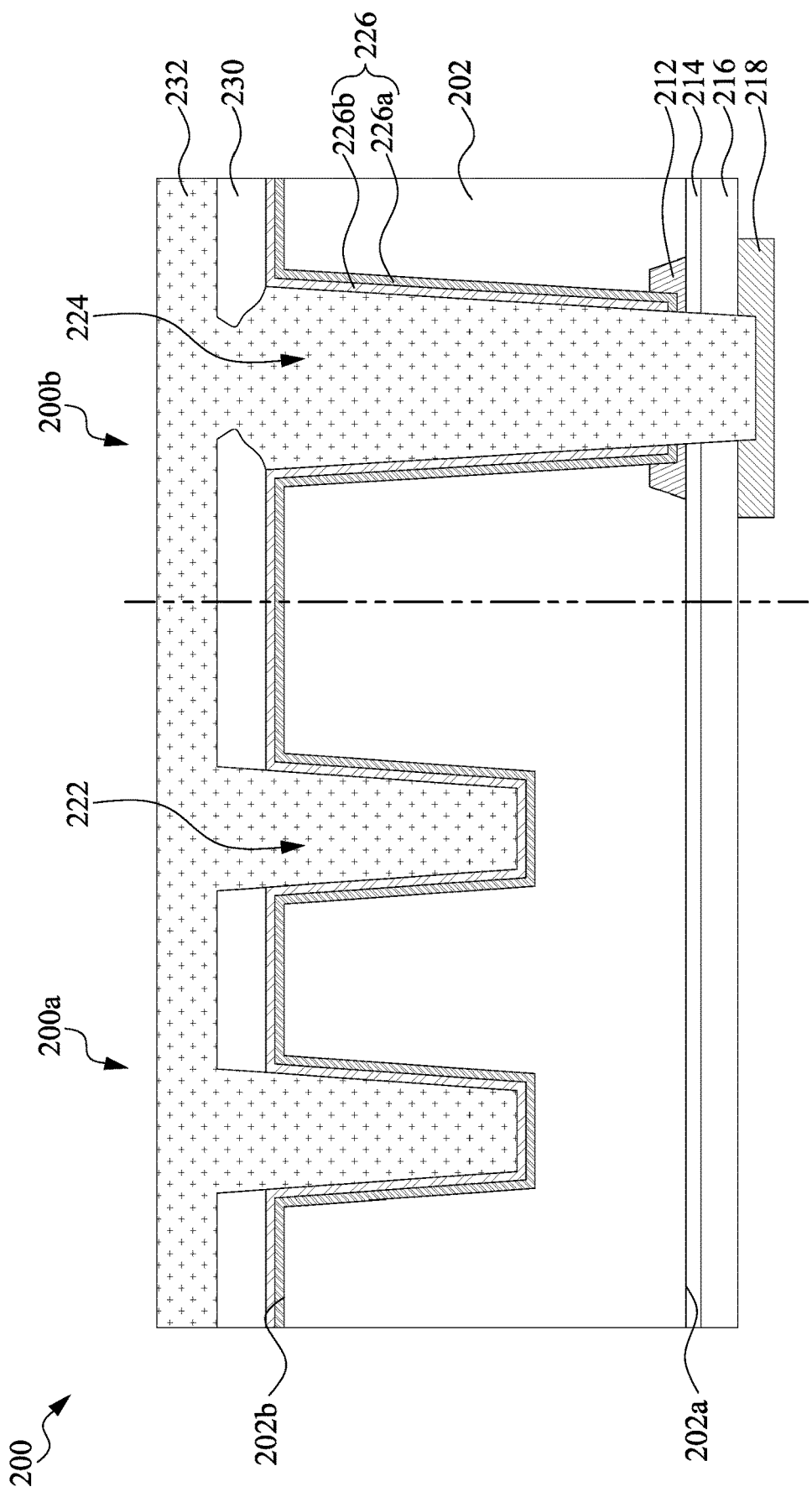

Refer to FIG. 2G. FIG. 2G illustrates a schematic cross-sectional view of an image sensor 200 in accordance with some embodiments of the present disclosure. In some embodiments, after the etching operation, a conductive material 232 may be formed on the insulating layer 230 and filled within the first hole 222 and the second hole 224, in some embodiments, after the formation of the conductive material 232 in the second hole 224, an insulating feature may be further formed within the conductive material in the second hole 224.

Figure 2H:
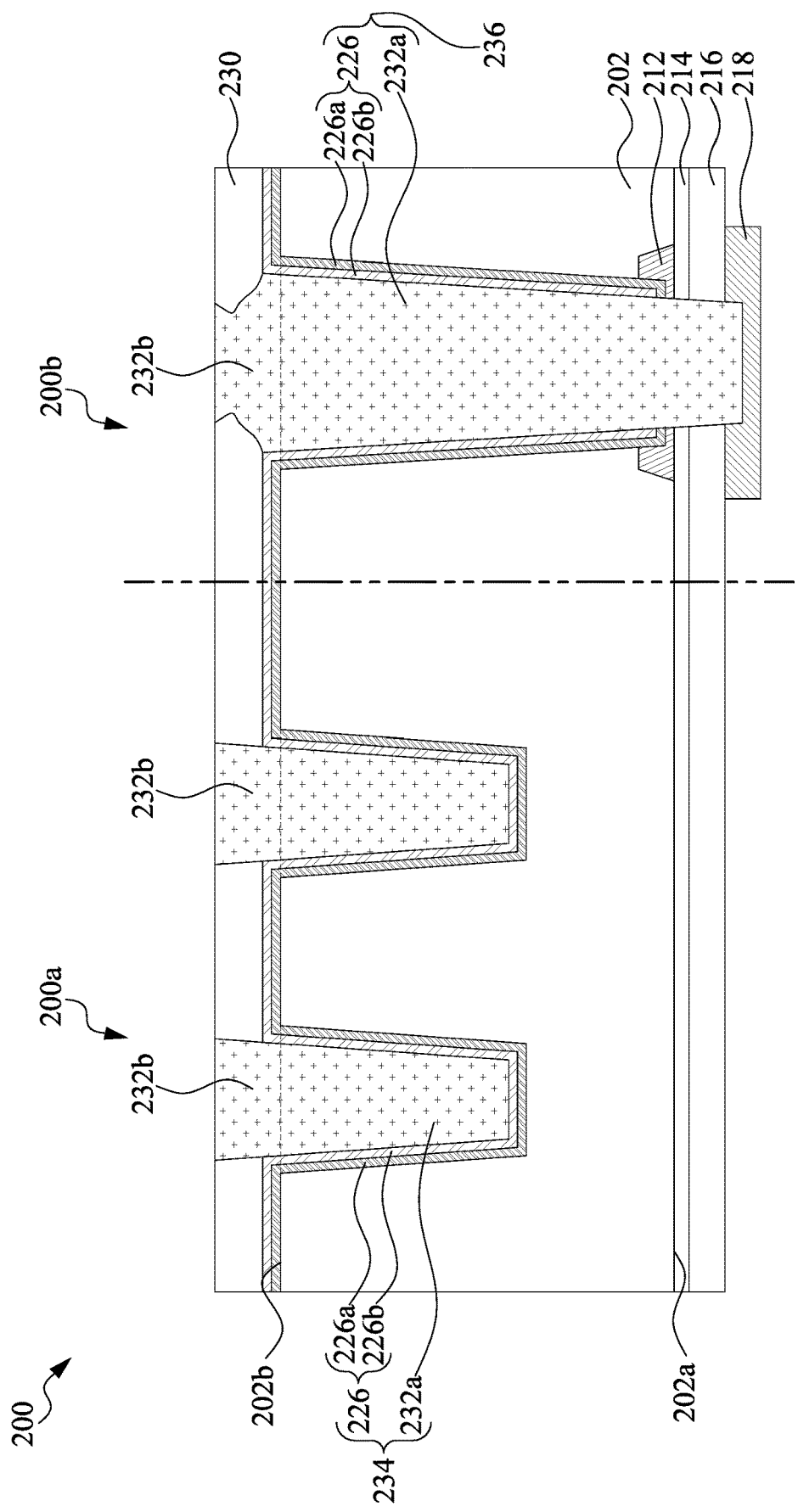
Figure 4:
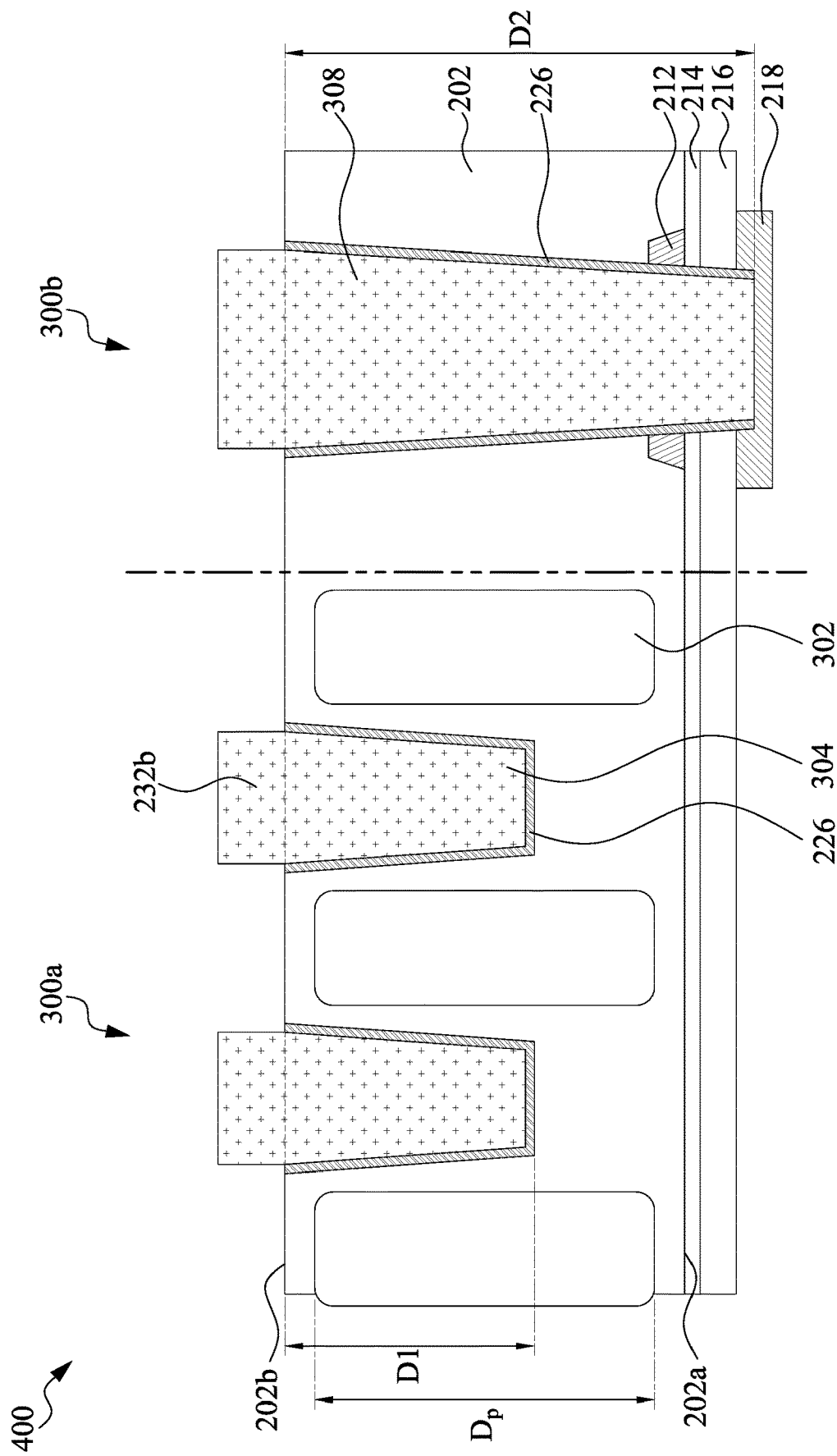
FIG. 4 illustrates a cross-sectional view of a portion of an image sensor in accordance with some embodiments of the present disclosure.

Refer to FIG. 2H. FIG. 2H illustrates a schematic cross-sectional view of an image sensor 200 in accordance with some embodiments of the present disclosure. In some embodiments, a portion of the conductive material 232 may be removed to form a conductive feature 232a in the first hole 222 and the second hole 224. In some embodiments, a portion of the conductive material 232 may be removed by a planarization method, such as a chemical mechanical polishing operation. In some embodiments, the chemical mechanical polishing operation may be carried out to remove a portion of the conductive material 232 until the insulating layer 230 is exposed. In some embodiments, a portion of the conductive material 232 may remained on the first hole 222 and the second hole 224 to form a conductive grid 232b. In some embodiments, the isolation feature 234 may be formed by the first hole 222 filled with the conductive feature 232a. In some embodiments, the connecting feature 236 may be formed by the second hole 224 filled with the conductive feature 232a. In some embodiments, the image sensor 200 may include a plurality of pixel sensors formed within the substrate 202 prior to the formation of the isolation feature 234 and the connecting feature 236. The pixel sensors may be separated by the isolation feature 234, which corresponds to the combination of the sensor isolation feature 304 and the dielectric layer 226, and the connecting feature 236, which corresponds to the combination of the periphery connecting feature 308 and the dielectric layer 226, as shown in FIG. 4. In some embodiments, the conductive grid 232b may act as a reflector to reflect the incident light so that more incident light may enter the pixel sensor so as to improve the quantum efficiency of the pixel sensors.

Figure 3:
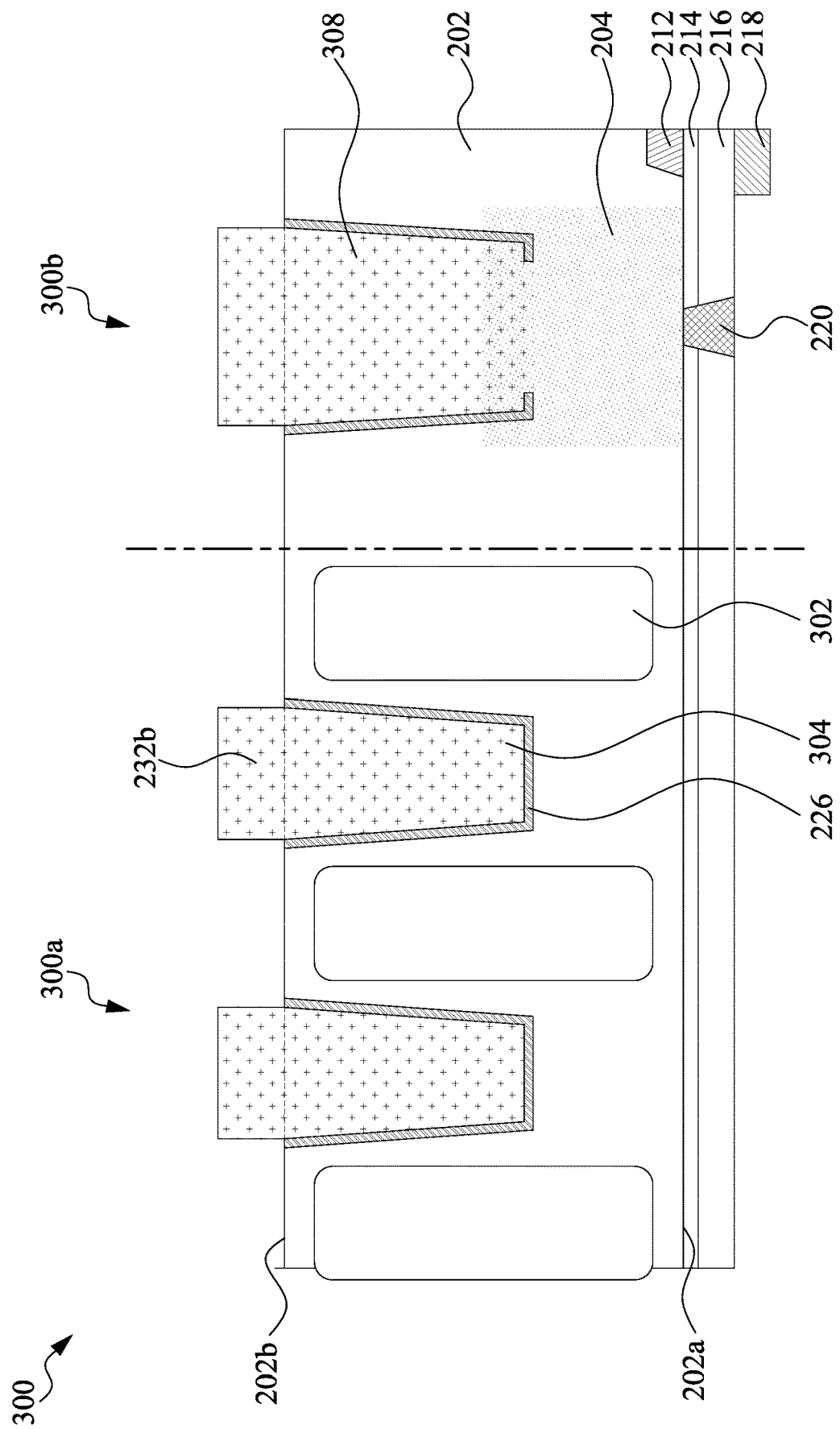
FIG. 3 illustrates a cross-sectional view of a portion of an image sensor in accordance with some embodiments of the present disclosure.

In some embodiments, for an image sensor including a doped well region 204 as shown in FIG. 2B, after the dielectric layer 226 is formed on sidewalls and a bottom of the first hole 222 and sidewalls and a bottom of the second hole 224, an insulating layer 230 may be formed on the second surface 202b of the substrate 202 to seal the first hole 222 and partially seal the second hole 224. In some embodiments, an etching operation may be applied to the insulating layer 230 to remove the dielectric layer 226 on the bottom of the second hole 224 so that the second hole 224 inserts into the doped well region 204 in a greater proportion. In some embodiments, a conductive feature 232a may be formed in the first hole 222 and the second hole 224 to form an isolation feature 234 and a connecting feature 236, respectively. In some embodiments, the connecting feature 236 may be electrically connected to the contact feature 220 through the doped well region 204. In some embodiments, the image sensor 200 may include a plurality of pixel sensors formed within the substrate 202 prior to the formation of the isolation feature 234 and the connecting feature 236. The pixel sensors may be separated by the isolation feature 234 and the connecting feature 236 as shown in FIG. 3. In some embodiments, the conductive grid 232b may act as a reflector to reflect the incident light so that more incident light may enter the pixel sensor so as to improve the quantum efficiency of the pixel sensors.

Refer to FIG. 3. FIG. 3 illustrates a cross-sectional view of a portion of an image sensor 300 in accordance with some embodiments of the present disclosure. The image sensor 300 may include a substrate 202, a plurality of pixel sensors 302, a sensor isolation feature 304, and a dielectric layer 226. The substrate 202 may include a first surface 202a and a second surface 202b opposite the first surface. The plurality of pixel sensors 302 may be disposed in the substrate 202. The sensor isolation feature 304 may be disposed in the substrate 202 defining an active region 300a. The dielectric layer 226 may be disposed between the sensor isolation feature 304 and the substrate 202. The sensor isolation feature 304 includes a conductive material. In some embodiments the conductive material may include a metal, a metal alloy or a combination thereof. In sonic embodiments, the conductive material may include tungsten, copper, aluminum-copper alloy, or combinations thereof. In some embodiments, the dielectric layer 226 may include one or more dielectric films. In some embodiments, the dielectric layer 226 may include a first dielectric film between the sensor isolation feature 304 and the substrate 202, and a second dielectric film between the first dielectric film and the conductive material. In some embodiments, the first dielectric film may include a high-k material. In some embodiments, the high-k material may include zirconium oxide, hafnium oxide, aluminum oxide, titanium oxide, tantalum oxide or combinations thereof. In some embodiments, the second dielectric film may include an oxide material.

In some embodiments, the image sensor 300 may further include a periphery connecting feature 308 disposed in the substrate 202 at a periphery region 300b outside the active region 300a. In some embodiments, the periphery connecting feature 308 may include a conductive material. In some embodiments the conductive material may include a metal, a metal alloy or a combination thereof. In some embodiments, the conductive material may include tungsten, copper, aluminum-copper alloy, or combinations thereof. In some embodiments, the periphery connecting feature 308 may include the conductive material of the sensor isolation feature 304. In some embodiments, the image sensor 300 may further include a conductive grid 232b disposed on the second surface 202b of the substrate 202 and connecting the sensor isolation feature 304 to the periphery connecting feature 308. In some embodiments, the conductive grid 232b may expose the plurality of pixel sensors 302. In some embodiments, the conductive grid 232b may include a conductive material. In some embodiments the conductive material may include a metal, a metal alloy or a combination thereof. In some embodiments, the conductive material may include tungsten, copper, aluminum-copper alloy, or combinations thereof. In some embodiments, the conductive grid 232b may include the conductive material of the sensor isolation feature 304.

In some embodiments, the image sensor 300 may further include active elements such as transistors on the first surface 202a of the substrate 202. In some embodiments, the active elements are separated by an isolation region 212 (not shown in FIG. 3). In some embodiments, the image sensor 300 may further include an interconnect feature 218 disposed on the first surface 202a of the substrate 202. In some embodiments, the active elements may be connected to an interconnect feature 218 through a contact feature 220. In some embodiments, the image sensor 300 may further include a doped well region 204. In some embodiments, the doped well region 204 may be formed between the periphery connecting feature 308 and the interconnect feature 218 disposed on the first surface 202a of the substrate 202. In some embodiments, the doped well region 204 may be electrically connected to the periphery connecting feature 308 and the contact feature 220.

In some embodiments, the plurality of pixel sensors 302 may be formed adjacent to the second surface 202b of the substrate 202. In some embodiments, the sensor isolation feature 304 may be formed adjacent to the second surface 202b of the substrate 202. In some embodiments, the periphery connecting feature 308 may be formed adjacent to the second surface 202b of the substrate 202. In some embodiments, the periphery connecting feature 308 may be formed aligned with the contact feature 220.

The image sensors and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Refer to FIG. 4. FIG. 4 illustrates a cross-sectional view of a portion of an image sensor 400 in accordance with some embodiments of the present disclosure, in some embodiments, the periphery connecting feature 308 may extend through the substrate 202 to contact an interconnect feature 218 disposed on the first surface 202a of the substrate 202. In some embodiments, as shown in FIG. 2C, a width difference between the first hole 222 and the second hole 224 may be defined so that the first hole 222 may have a width smaller than that of the second hole. In some embodiments, after an etching operation is performed, due to the width difference, the first hole 222 has depth D1 smaller than the depth D2 of the second hole 224. In some embodiments, as shown in FIG. 2E, after the dielectric layer 226 is formed on sidewalk and a bottom of the first hole 222 and the second hole 224, an insulating layer 230 may be formed on the second surface 202b of the substrate 202 to seal the first hole 222 and partially seal the second hole 224. In some embodiments, as shown in FIG. 2F, an etching operation may be applied to the insulating layer 230 to remove a portion of the insulating layer 230 and the dielectric layer 226 on the bottom of the second hole so that the second hole 224 may extend through the substrate 202 to reach the interconnect structure 218 formed on the first surface 202a of the substrate 202. In some embodiments, a conductive material 232 may be formed within the second hole 224 to form the periphery connecting feature 308 as shown in FIG. 4. In some embodiments, one or more layers may be formed between the interconnect feature 218 and the first surface 202a of the substrate 202, such as an etch stop layer 214 and an inter-layer dielectric layer 216. In some embodiments, the periphery connecting feature 308 may be aligned with and extends through an isolation region 212 formed adjacent to the first surface 202a of the substrate 202. In some embodiments, the sensor isolation feature 304 may have a first depth D1 and the plurality of pixel sensors may have a pixel depth $D_p$. In some embodiments, the first depth D1 may be less than the pixel depth $D_p$ and that the sensor isolation feature 304 may provide a partial isolation to the plurality of pixel sensors 302.

Figure 5:
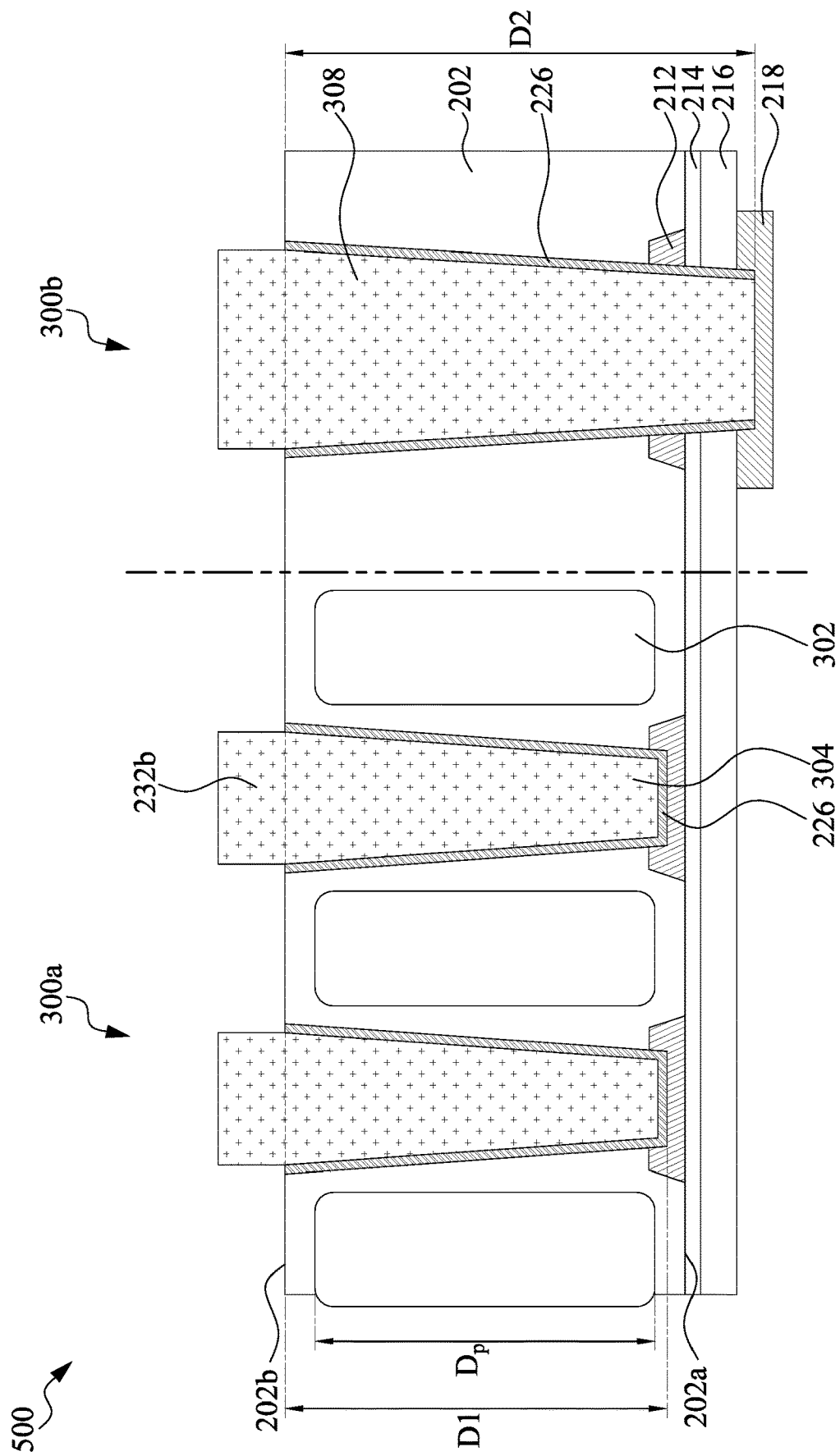
FIG. 5 illustrates a cross-sectional view of a portion of an image sensor in accordance with some embodiments of the present disclosure.

Refer to FIG. 5. FIG. 5 illustrates a cross-sectional view of a portion of an image sensor 500 in accordance with some embodiments of the present disclosure. In some embodiments, the first depth $D_1$ may be equal to or deeper than the pixel depth $D_p$ and that the sensor isolation feature 304 may provide a full isolation to the plurality of pixel sensors 302. In some embodiments, the sensor isolation feature 304 may be in contact with the isolation region 212 adjacent to the first surface 202a of the substrate 202. In some embodiments, as described above with respect to FIG. 2C, a photolithographic operation may be performed to the second surface 202b of the substrate 202 to define a pattern of the first hole 222 and the second hole 224. In some embodiments, a width difference between the first hole 222 and the second hole 224 may be defined to a value smaller than that as shown in FIG. 4. In some embodiments, an etching operation may be performed to the second surface 202b of the substrate 202 to remove a portion of the substrate 202 to form the first hole 222 and the second hole 224 with a depth difference smaller than that as described above with respect to FIG. 4. In some embodiments, the first hole 222 may extend to protrude into the isolation region 212 adjacent to the first surface 202a of the substrate 202. In some embodiments, a conductive material 232 may be formed within the first hole 222 to form the sensor isolation feature 304 as shown in FIG. 5.

Figure 6:
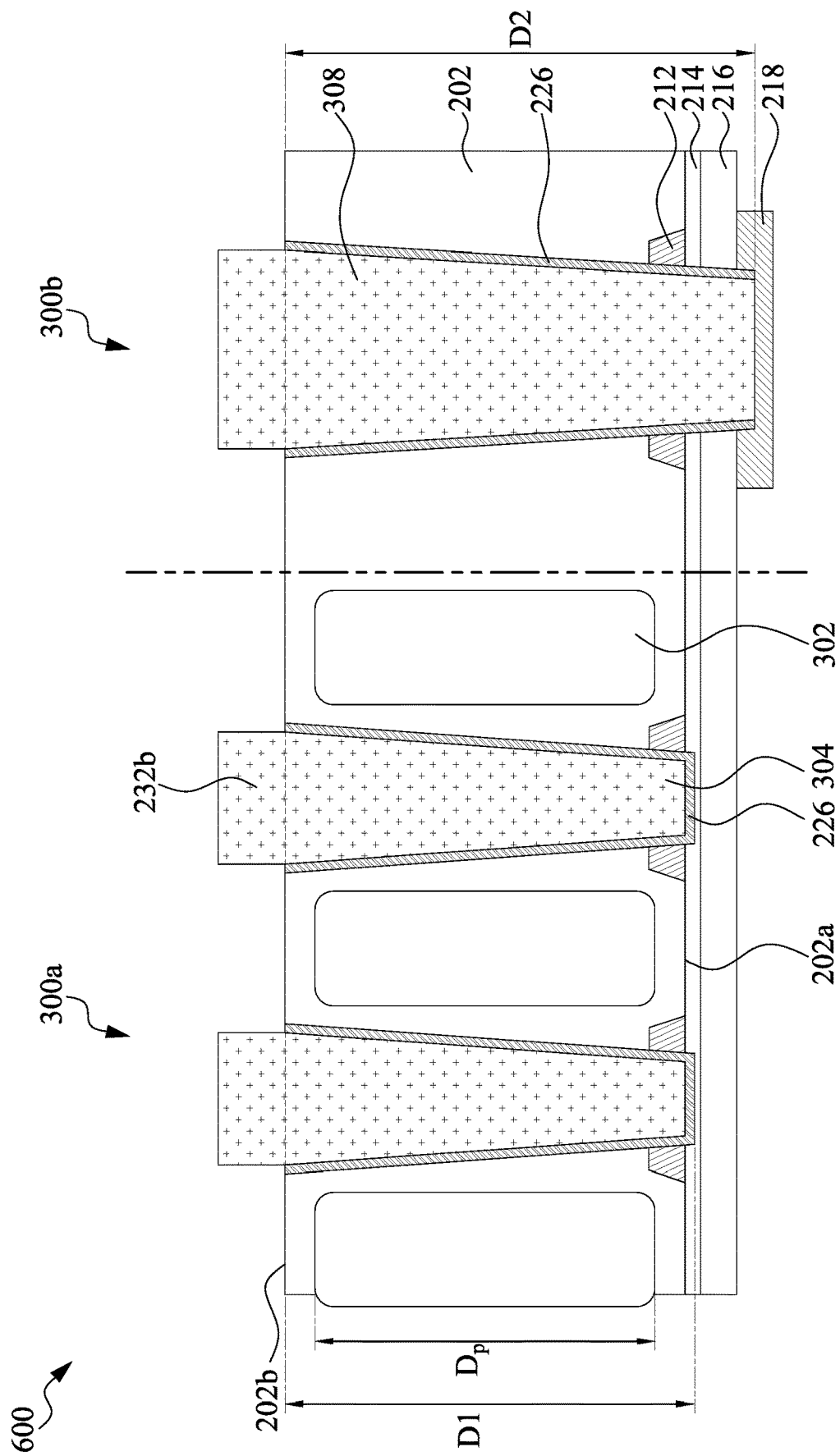
FIG. 6 illustrates a cross-sectional view of a portion of an image sensor in accordance with some embodiments of the present disclosure.

Refer to FIG. 6. FIG. 6 illustrates a cross-sectional view of a portion of an image sensor 600 in accordance with some embodiments of the present disclosure. In some embodiments, the sensor isolation feature 304 may extend through the substrate 202. In some embodiments, the sensor isolation feature 304 may be in contact with the etch stop layer 214 disposed on the first surface 202a of the substrate 202. In some embodiments, as described above with respect to FIG. 2C, a photolithographic operation may be performed to the second surface 202b of the substrate 202 to define a pattern of the first hole 222 and the second hole 224. In some embodiments, a width difference between the first hole 222 and the second hole 224 may be defined to a value smaller than that as shown in FIG. 5. In some embodiments, an etching operation may be performed to the second surface 202b of the substrate 202 to remove a portion of the substrate 202 to form the first hole 222 and the second hole 224 with a depth difference smaller than that as described above with respect to FIG. 5. In some embodiments, the first hole 222 may extend through the isolation region 212 and be in contact with the etch stop layer 214 disposed on the first surface 202a of the substrate 202. In some embodiments, a conductive material 232 may be formed within the first hole 222 to form the sensor isolation feature 304 as shown in FIG. 6.

Figure 7:
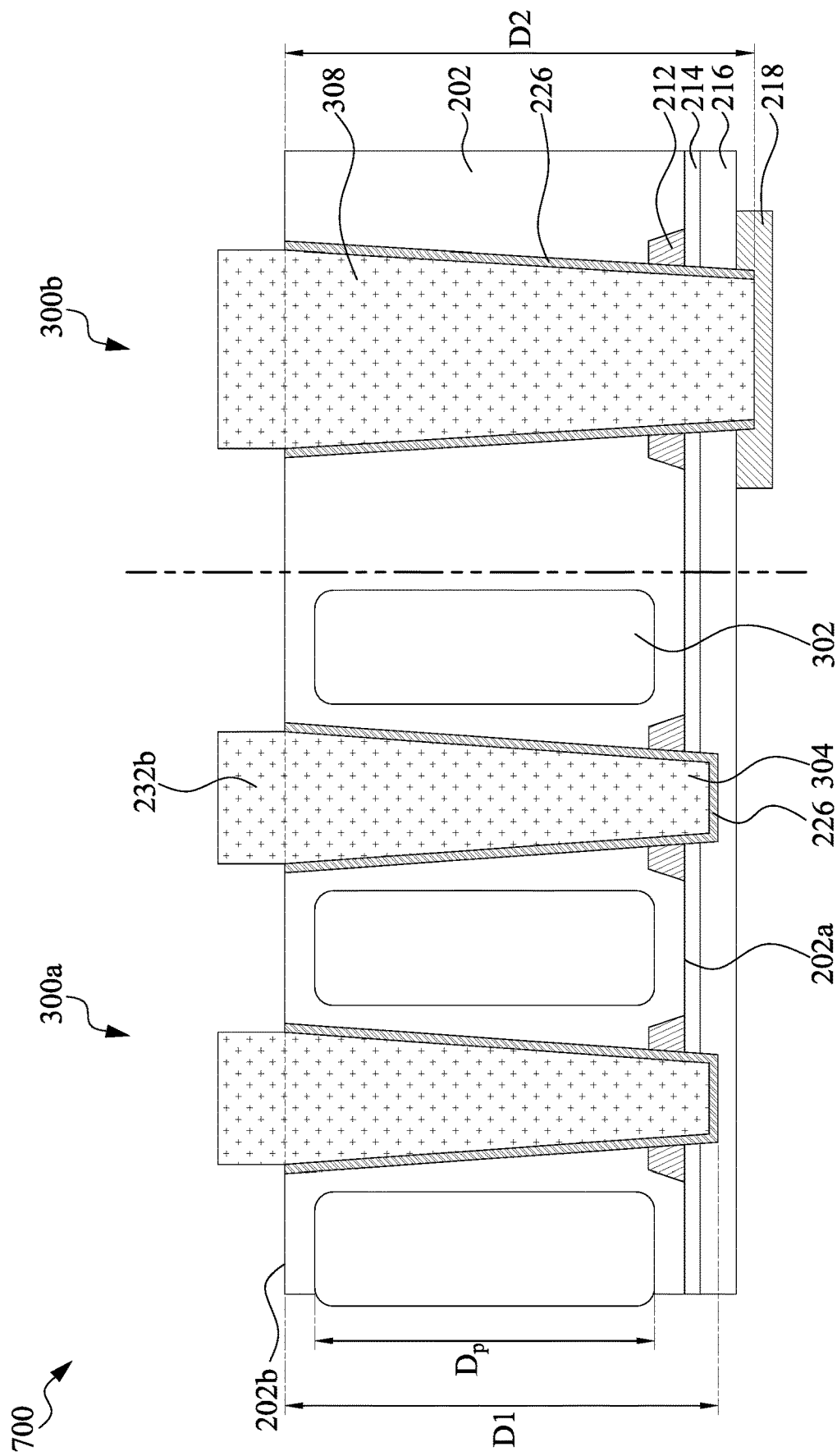
FIG. 7 illustrates a cross-sectional view of a portion of an image sensor in accordance with some embodiments of the present disclosure.

Refer to FIG. 7. FIG. 7 illustrates a cross-sectional view of a portion of an image sensor 700 in accordance with some embodiments of the present disclosure. In some embodiments, the sensor isolation feature 304 may extend through the substrate 202 and the etch stop layer 214 disposed on the first surface 202a of the substrate. In some embodiments, the sensor isolation feature 304 may be in contact with the inter-layer dielectric layer 216 disposed on the etch stop layer 214. In some embodiments, as described above with respect to FIG. 2C, a photolithographic operation may be performed to the second surface 202b of the substrate 202 to define a pattern of the first hole 222 and the second hole 224. In some embodiments, a width difference between the first hole 222 and the second hole 224 may be defined to a value smaller than that as shown in FIG. 6. In some embodiments, an etching operation may be performed to the second surface 202b of the substrate 202 to remove a portion of the substrate 202 to form the first hole 222 and the second hole 224 with a depth difference smaller than that as described above with respect to FIG. 6. In some embodiments, the first hole 222 may extend through the substrate 202 and the etch stop layer 214 disposed on the first surface 202a of the substrate to be in contact with the inter-layer dielectric layer 216 disposed on the etch stop layer 214. In some embodiments, a conductive material 232 may be formed within the first hole 222 to form the sensor isolation feature 304 as shown in FIG. 7.

Figure 8:
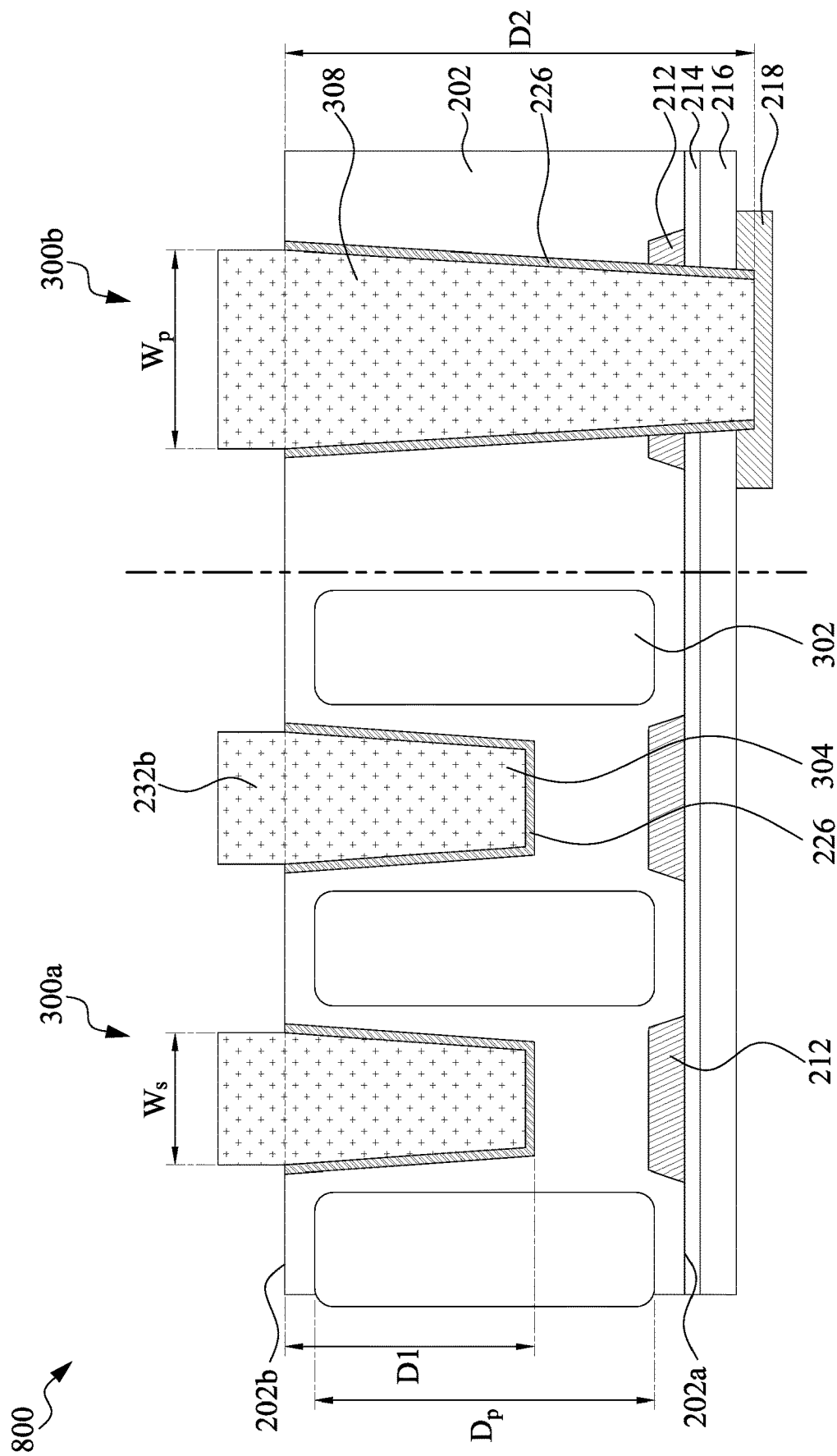
FIG. 8 illustrates a cross-sectional view of a portion of an image sensor in accordance with some embodiments of the present disclosure.

Refer to FIG. 8. FIG. 8 illustrates a cross-sectional view of a portion of an image sensor 800 in accordance with some embodiments of the present disclosure. In some embodiments, the image sensor 800 may include a substrate 202, a sensor isolation feature 302, a periphery connecting feature 308, and a dielectric layer 226. The substrate 202 may include a first surface 202a and a second surface 202b opposite the first surface 202a. The sensor isolation feature 302 may be disposed within the substrate 202 extending from the second surface 202b toward the first surface 202a. The periphery connecting feature 308 may be disposed within the substrate 202 extending from the second surface 202b of the substrate 202. The dielectric layer 226 may be disposed over sidewalls and bottoms of the sensor isolation feature 304 and sidewall of the periphery connecting feature 308.

In some embodiments, the sensor isolation feature 304 may be electrically connected to the periphery connecting feature 308. In some embodiments, the image sensor 800 may further include a conductive grid 232b. In some embodiments, the sensor isolation feature 304 may be electrically connected to the periphery connecting feature 308 by the conductive grid 232b. In some embodiments, the periphery connecting feature 308 has a width $W_p$ larger than a width $W_s$ of the sensor isolation feature 304. In some embodiments, the image sensor 800 may further include an isolation region 212 disposed in the substrate 202. In some embodiments, the isolation region 212 may extend from the first surface 202a toward the second surface 202b of the substrate 202, wherein the sensor isolation feature 304 may be aligned with and apart from the isolation region 212.

Figure 9:
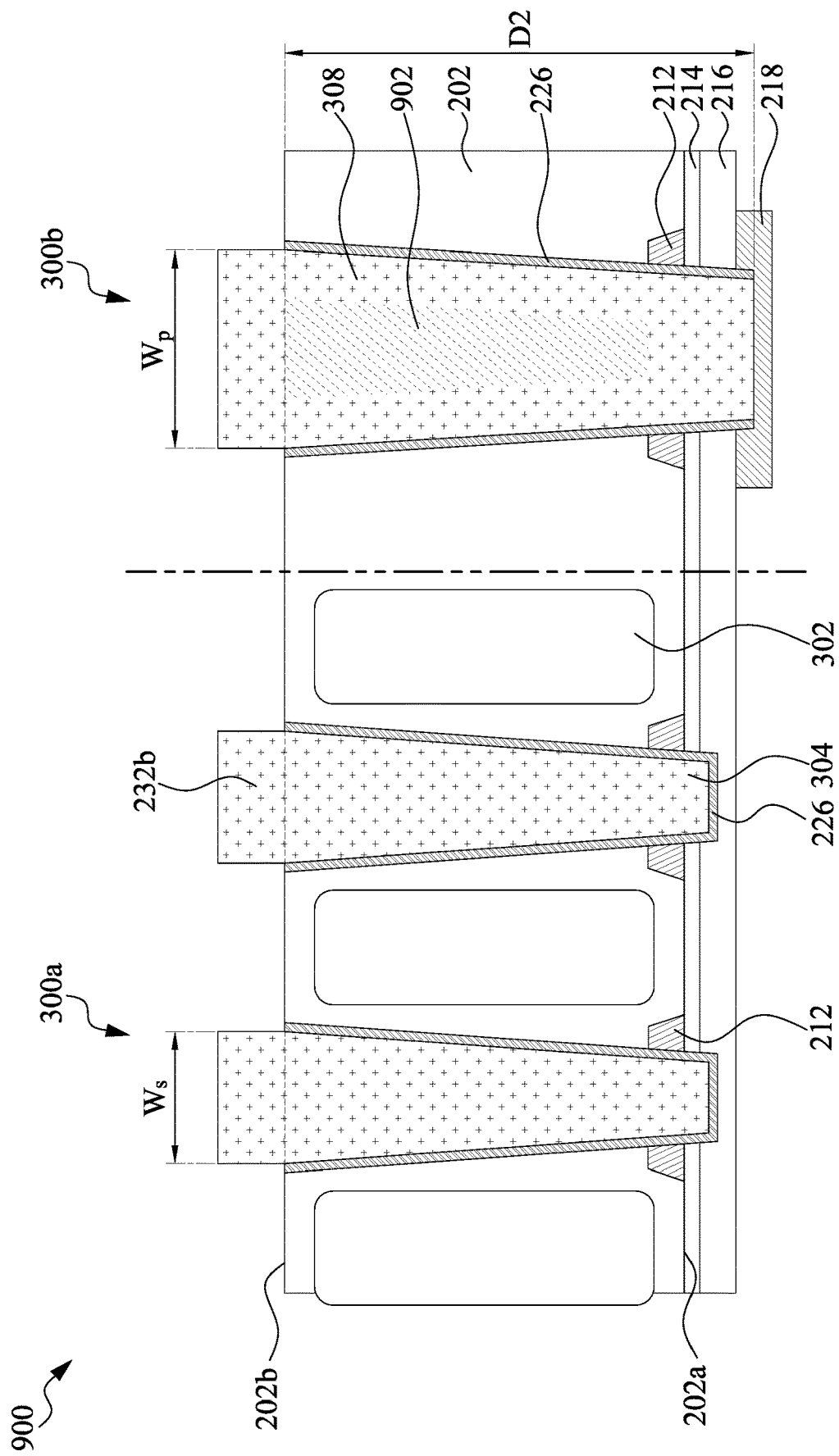
FIG. 9 illustrates a cross-sectional view of a portion of an image sensor in accordance with some embodiments of the present disclosure.

Refer to FIG. 9. FIG. 9 illustrates a cross-sectional view of a portion of an image sensor 900 in accordance with some embodiments of the present disclosure. In some embodiments, the image sensor 900 may further include an isolation region 212 disposed in the substrate 202. In some embodiments, the isolation region 212 may extend from the first surface 202a toward the second surface 202b of the substrate 202, wherein the sensor isolation feature may be inserted into the isolation region 212. In some embodiments, the sensor isolation feature may extend through the isolation region 212. In some embodiments, the image sensor 900 may further include an insulation feature 902 inserted into the periphery connecting feature. In some embodiments, the insulation feature 902 may further include a dielectric layer, such as an oxide layer. In some embodiments, the image sensor 900 may further include a conductive grid 232b disposed on the second surface 202b of the substrate 202. In some embodiments, the conductive grid 232b may connect the sensor isolation feature 304 to the periphery connecting feature 308.

Figure 10:
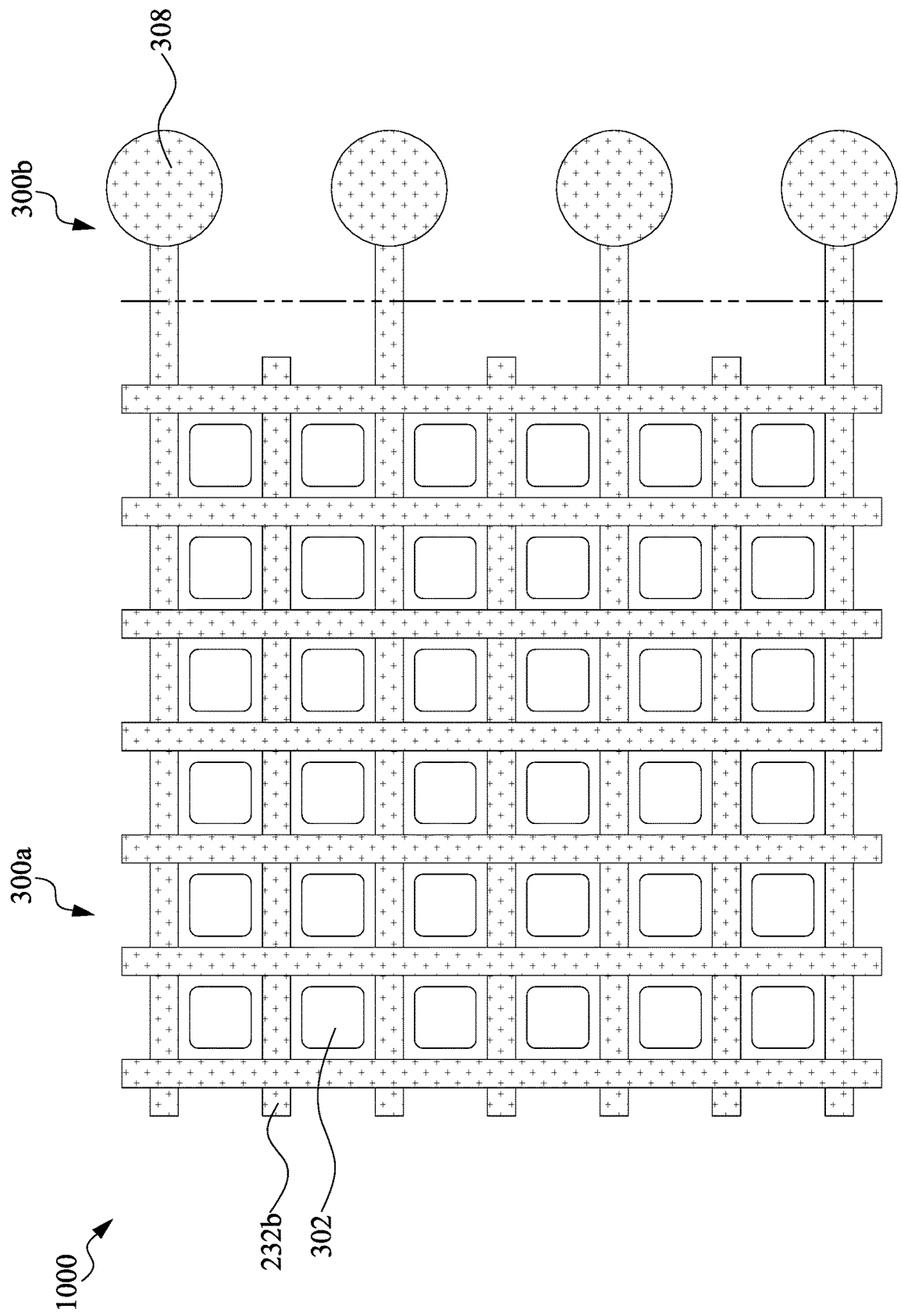
FIG. 10 illustrates a top view of a portion of an image sensor in accordance with some embodiments of the present disclosure.

Refer to FIG. 10. FIG. 10 illustrates a top view of a portion of an image sensor 1000 in accordance with some embodiments of the present disclosure. In some embodiments, the image sensor 1000 may include any of the aforementioned image sensors 300, 400, 500, 600, 700, 800 and 900. In some embodiments, the plurality of pixel sensors 302 may be enclosed by the sensor isolation feature 304 (not shown) with the conductive grid 232b disposed over the sensor isolation feature 304. In some embodiments, the conductive grid 232b may connect the sensor isolation feature 304 to the periphery connecting feature 308.

In the present disclosure, an image sensor including a sensor isolation feature including a conductive material is provided. The image sensor may include a plurality of active elements such as transistors formed on a first surface of a substrate with the sensor isolation feature formed on a second surface of the substrate. The sensor isolation feature may have a depth less than the depth of the pixel sensors to be isolated by the sensor isolation feature. The sensor isolation feature connects bias by a periphery connecting feature connecting to a contact feature of the active elements or an interconnect feature formed over first surface of the substrate, and the pixel sensors may be isolated by the partial isolation of the sensor isolation feature. Therefore, even if the size of the pixel sensors and the width of the sensor isolation feature may be shrunk in the advanced technology nodes, the sensor isolation feature may be kept in a relatively less depth, which are easier to be manufactured. In addition, using a conductive material for manufacturing the sensor isolation feature, the conductive grid disposed over the sensor isolation feature may be formed along with the sensor isolation feature in the same operation. Such may lead to an easier and faster manufacturing operation. The conductive grid may serve as a reflector for improving the quantum efficiency of the pixel sensors for better collection of the incident light as the incident light may be reflected by the conductive grid to enter the pixel sensors enclosed by the conductive grid. In addition, cross talk between neighboring pixel sensors may also be reduced and sensitivity of the pixel sensor may be improved with the use of the conductive grid.

In some embodiments, an image sensor is provided. The image sensor includes a substrate comprising a first surface and a second surface opposite to the first surface, a plurality of pixel sensors disposed in the substrate, a sensor isolation feature disposed in the substrate defining an active region; and a dielectric layer between the sensor isolation feature and the substrate, wherein the sensor isolation feature includes a conductive material.

In some embodiments, an image sensor is provided. The image sensor includes a substrate comprising a first surface and a second surface opposite to the first surface, a sensor isolation feature disposed within the substrate extending from the second surface toward the first surface, a periphery connecting feature disposed within the substrate extending from the second surface of the substrate; and a dielectric layer disposed over sidewalls and bottoms of the sensor isolation feature and sidewall of the periphery connecting feature.

In some embodiments, a method for manufacturing an image sensor is provided. The methods includes following operations. A substrate having a first surface and a second surface opposite to the first surface is provided. An isolation feature is formed in the substrate, wherein the isolation feature at least partially laterally enclose a pixel sensor in an active region of the substrate, and the isolation feature includes a conductive feature and a dielectric layer between the conductive feature and the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a substrate comprising a first surface and a second surface opposite to the first surface;
a plurality of pixel sensors disposed in the substrate;
a sensor isolation feature disposed in the substrate defining an active region;
a dielectric layer between the sensor isolation feature and the substrate;
a periphery connecting feature disposed in the substrate at a periphery region outside the active region; and
a conductive grid disposed on the second surface and over the sensor isolation feature,
wherein the sensor isolation feature comprises a conductive material,
wherein the dielectric layer is disposed in a bottom of the sensor isolation feature and is inserted into an isolation region disposed in the substrate, and
wherein a portion of the isolation region is present between the dielectric layer disposed in the bottom of the sensor isolation feature and the first surface of the substrate,
wherein the conductive grid connects the sensor isolation feature to the periphery connecting feature, and
wherein the periphery connecting feature penetrates through the first surface of the substrate, an etch stop layer formed on the first surface of the substrate, and an inter-layer dielectric layer formed on the etch stop layer.

2. The image sensor according to claim 1, wherein the periphery connecting feature comprises the conductive material of the sensor isolation feature.

3. The image sensor according to claim 1, wherein the conductive grid exposes the plurality of pixel sensors.

4. The image sensor according to claim 1, wherein the periphery connecting feature extends through the substrate to contact with an interconnect feature disposed on the inter-layer dielectric layer.

5. The image sensor according to claim 1, wherein the sensor isolation feature has a first depth and the plurality of pixel sensors have a pixel depth, and wherein the first depth is deeper than the pixel depth.

6. The image sensor of claim 1, wherein the sensor isolation feature is formed adjacent to the second surface of the substrate.

7. The image sensor of claim 6, wherein a portion of the sensor isolation feature is within the isolation region.

8. The image sensor according to claim 1, wherein the dielectric layer comprises one or more dielectric films.

9. The image sensor of claim 1, wherein the sensor isolation feature includes a conductive material.

10. An image sensor, comprising:
a substrate comprising a first surface and a second surface opposite to the first surface;
a sensor isolation feature disposed within the substrate extending from the second surface toward the first surface;

a periphery connecting feature disposed within the substrate extending from the second surface of the substrate;

a dielectric layer disposed over sidewalls and a bottom of the sensor isolation feature and sidewall of the periphery connecting feature; and a conductive grid disposed on the second surface and over the sensor isolation feature, wherein the dielectric layer is disposed in the bottom of the sensor isolation feature and is inserted into an isolation region disposed in the substrate, wherein a portion of the isolation region is present between the dielectric layer disposed in the bottom of the sensor isolation feature and the first surface of the substrate, wherein the conductive grid connects the sensor isolation feature to the periphery connecting feature, and wherein the periphery connecting feature penetrates through the first surface of the substrate, an etch stop layer formed on the first surface of the substrate, and an inter-layer dielectric layer formed on the etch stop layer.

11. The image sensor according to claim 10, wherein the sensor isolation feature is electrically connected to the periphery connecting feature.

12. The image sensor according to claim 10, wherein a width of the periphery connecting feature is larger than a width of the sensor isolation feature.

13. The image sensor according to claim 10, wherein a portion of the sensor isolation feature is within the isolation region.

14. The image sensor according to claim 10, wherein the dielectric layer comprises one or more dielectric films.

15. The image sensor of claim 10, wherein the sensor isolation feature includes a conductive material.

16. An image sensor, comprising:

a substrate comprising a first surface and a second surface opposite to the first surface;

a sensor isolation feature disposed within the substrate extending from the second surface toward the first surface, wherein the sensor isolation feature has a first depth;

a periphery connecting feature disposed within the substrate extending from the second surface of the substrate, wherein the periphery connecting feature has a second depth;

a dielectric layer disposed over sidewalls and a bottom of the sensor isolation feature and sidewall of the periphery connecting feature; and a conductive grid disposed on the second surface and over the sensor isolation feature, wherein the first depth is smaller than the second depth, wherein the dielectric layer is disposed in the bottom of the sensor isolation feature and is inserted into an isolation region disposed in the substrate, wherein a portion of the isolation region is present between the dielectric layer disposed in the bottom of the sensor isolation feature and the first surface of the substrate, wherein the conductive grid connects the sensor isolation feature to the periphery connecting feature, and wherein the periphery connecting feature penetrates through the first surface of the substrate, an etch stop layer formed on the first surface of the substrate, and an inter-layer dielectric layer formed on the etch stop layer.

17. The image sensor of claim 16, wherein the sensor isolation feature is electrically connected to the periphery connecting feature.

18. The image sensor of claim 16, wherein a width of the periphery connecting feature is larger than a width of the sensor isolation feature.

19. The image sensor of claim 16, wherein the sensor isolation feature includes a conductive material.

20. The image sensor of claim 19, wherein the conductive material comprises a metal, a metal alloy or a combination thereof.

* * * * *